(12) United States Patent
Murguia

(10) Patent No.: US 7,582,985 B2
(45) Date of Patent: Sep. 1, 2009

(54) ELECTRICAL ENERGY SAVING SYSTEM

(76) Inventor: José Tomás Ortega Murguia, Av. Camarón Sabalo #306 - Local 10 Centro Comercial La Misión, Mazatlán, Sinaloa (MX) 82110

( * ) Notice: Subject to any disclaimer, the term of this patent is extended or adjusted under 35 U.S.C. 154(b) by 901 days.

(21) Appl. No.: 10/466,358

(22) PCT Filed: Jun. 21, 2001

(86) PCT No.: PCT/MX01/00040

§ 371 (c)(1),
(2), (4) Date: Jul. 16, 2003

(87) PCT Pub. No.: WO02/056033

PCT Pub. Date: Jul. 18, 2002

(65) Prior Publication Data

US 2004/0046455 A1    Mar. 11, 2004

(30) Foreign Application Priority Data

Jan. 16, 2001    (MX) .................................. 000550

(51) Int. Cl.
*H02J 3/14* (2006.01)
(52) U.S. Cl. .............................. 307/39; 307/40; 700/295
(58) Field of Classification Search .................. 700/296, 700/292, 295, 286; 361/75; 307/34, 32, 307/35, 141.4, 39–41
See application file for complete search history.

(56) References Cited

U.S. PATENT DOCUMENTS

| | | | | |
|---|---|---|---|---|
| 4,031,406 A | * | 6/1977 | Leyde et al. | 307/41 |
| 4,471,232 A | * | 9/1984 | Peddie et al. | 307/35 |
| 5,051,607 A | * | 9/1991 | Dalton | 307/141 |
| 5,311,068 A | | 5/1994 | Miller | |
| 5,475,848 A | * | 12/1995 | Ikeda | 713/322 |
| 5,625,236 A | * | 4/1997 | Lefebvre et al. | 700/296 |
| 5,675,503 A | * | 10/1997 | Moe et al. | 700/296 |
| 6,137,699 A | * | 10/2000 | Sakamoto | 363/50 |
| 6,216,479 B1 | * | 4/2001 | Elwood | 62/230 |
| 6,700,333 B1 | * | 3/2004 | Hirshi et al. | 315/291 |
| 6,718,213 B1 | * | 4/2004 | Enberg | 700/296 |

FOREIGN PATENT DOCUMENTS

| | | |
|---|---|---|
| EP | 0 660 486 A1 | 6/1995 |
| EP | 0 783 111 A2 | 7/1997 |
| GB | 2 302 952 A | 2/1997 |
| WO | WO 95/12911 A1 | 5/1995 |

* cited by examiner

*Primary Examiner*—Albert W Paladini
(74) *Attorney, Agent, or Firm*—Foley & Lardner LLP

(57) ABSTRACT

An electric energy saving system characterized in that it consists on detecting the time span when there is an overload in the demand of energy of a region; providing a controller in certain number of devices and equipment connected to the energy distribution system of a region according to the overload registered at said region; programming the controllers to shutoff said devices or equipment for several short time periods, and in a staggered form, during said time span wherein there is an overload of the demand in the region, in such a way that a group of devices will be shut-off for one period, the expiration of which will indicate another group to do the same thing, and so forth.

25 Claims, 13 Drawing Sheets

ELECTRICAL ENERGY SAVING SYSTEM

FIELD OF THE INVENTION

This invention refers to an electric energy saving system which controls the consumption of energy by reducing the demand in critical hours.

At the present time, the human activity highly relies on electric power because a large quantity of equipment, machinery and domestic devices depend on it for their operation, and the demand of this kind of energy has been increasing according to the technology development, therefore mankind has looked for alternative means for the generation of this energy via thermoelectric, hydroelectric, nuclear, geothermal, and wind-operated plants, etc. Nevertheless, this also has an environmental cost, since diverse natural resources are used and the location of these plants always has an impact on the environment with irreversible consequences. Additionally, it is proper to mention that the resources for energy generation are being used up, consequently implantation of energy saving systems is required in order to reduce the load on the generation plants and to guarantee the energy supply for a longer term with a lesser environmental impact.

However, in spite of being a well-known problem, few efforts have been made to try to reduce the energy demand of consumers, including the worldwide applicable "daylight" saving plans, which have been effective although in a limited way.

Nowadays, diverse energy saving devices exist, which are installed in electric appliances such as lamps, electric ovens, irons, and others, as well as in computer devices, industrial equipment, etc., just as the one described in U.S. Pat. No. 4,520,259 to Frederick Schoenberger, which consists on an electric system to provide an energy load regulator to be used on electric laundry dryers and hot water electric tanks. However, this system as same as other existing ones in the closest prior art, has the inconvenience of being applicable exclusively in a reduced group of electric appliances, and the energy saving provided is not reflected in the demand of the region in which they are used.

It is known that the energy demand is variable along the day and it even varies according to the months of the year, which implies a fickle demand for the energy generation plants, with critical periods that affect their capacity and operation. Therefore, there is the necessity of a system allowing to moderate the critical demand periods for an optimal operation of the generation plants, which would require the consumption to be carried out more constantly, thereby achieving consumption savings.

SUMMARY OF THE INVENTION

The object of the invention is to provide a system that allows a reduction in the electric power consumption, whereupon the generation plants load would decrease, and therefore they would work in a more efficient way.

Another objective of the present invention is to make all the equipment making up the energy distribution system operate through programmed periods, so as to control the demand and electric power consumption in the moments that they significantly affect the capacity of the generation plants, in order to prevent the energy demand and consumption from reaching critical values.

One additional objective of the present invention is to avoid that said programming of the energy demand and consumption affects the operation of the equipment connected to the electric power system.

These objectives are achieved by means of the installation of electric power saving control devices in all appliances and electric equipment, and to synchronize them by means of an electronic system, so that they stop operating for short periods of time during the hours at which the energy consumption is critical for the energy generation plants, thereby achieving a plant operation as constant as possible. In this way the power generation plants would increase their capacity and would provide a greater number of services, without increasing their power generation capacity.

Moreover, from the point of view of the environmental impact, there won't be any increased since the consumption of fuels won't be required, and less pollution will be emitted.

DETAILED DESCRIPTION OF THE INVENTION

Figures 1A, 1B:
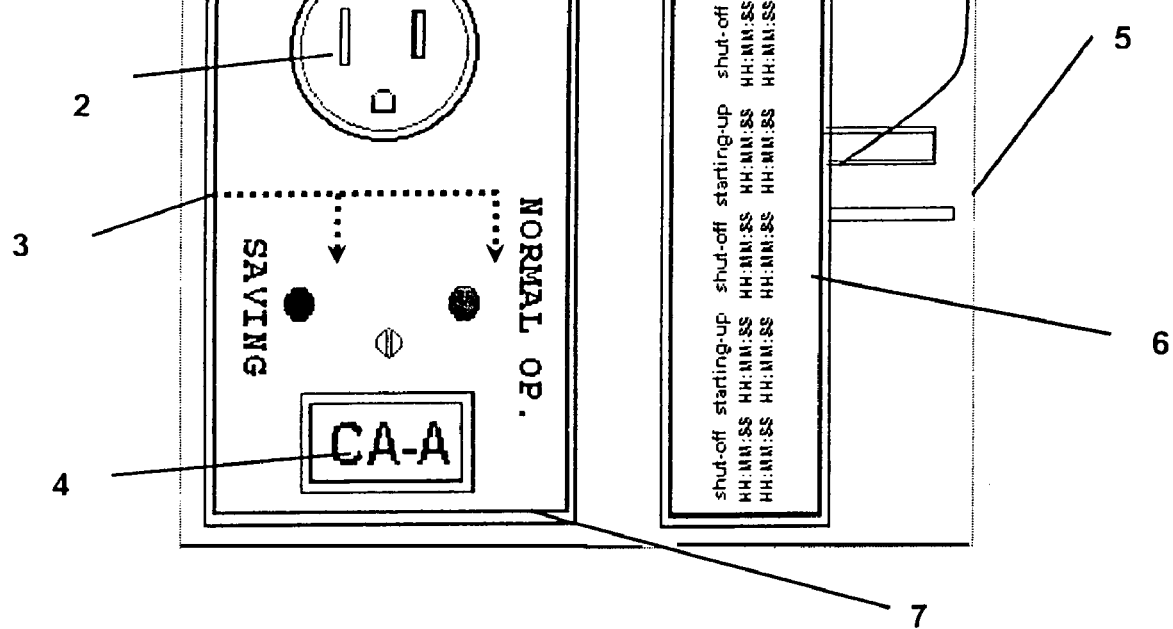
FIGS. 1a and 1b are diagrams showing the front and lateral faces, respectively, of a saving control device to be connected to electric appliances in order to be synchronized with the energy supply system.

The system of the invention consists in providing an energy saving control into electric appliances, as shown in FIGS. 1a and 1b, which contains the necessary information to identify its operation, said information being such as the type of saving control (controles ahorradores—CA) (4), the green LED indicates it is under operation and the red LED indicates that the equipment is saving energy (3), also the amperage (1) is indicated (in order to avoid that other appliances with greater consumption be connected). The timing (6) when the equipment is out of operation due to energy saving, will be observed in one side; this control is directly connected to the 127 V contact (5) and includes a controlled socket, the socket (2) serves to plug in any domestic or industrial appliance or equipment and operates as a built-in programmed circuit in order to operate in the desired form. The saving control is a timer device that shuts-off the equipment operation for small periods of time during the energy consumption critical hours, which generally imply a greater load in the energy generation plants, so their operation would be more constant and therefore more efficient.

Figure 2:
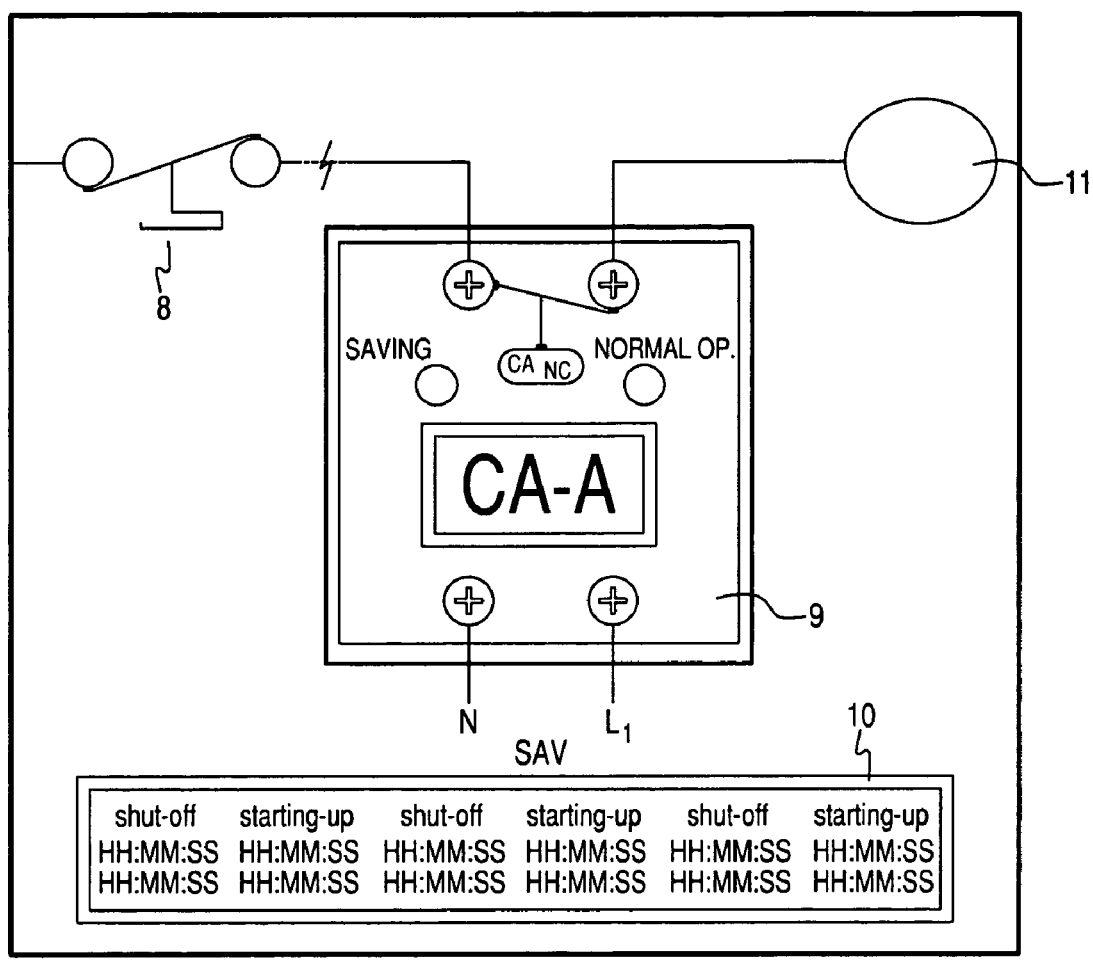
FIG. 2 is a diagram showing the elements of an energy control device and how it can be incorporated to new electric appliances, upon its manufacture.

For new equipment and high consumption equipment the recommendation is to use energy saving controls like the one shown in FIG. 2, which consists of a temperature sensor (8) for electric appliances such as refrigerators, air conditioners, freezers, etc. This type of saving control can be installed in almost every appliance (9) for its control, to accomplish the objective without affecting its operation. Furthermore, the controller must include, in a visible place on the equipment to be installed, one sticker (10) indicating the schedule of shut-off and starting-up periods for saving energy. On the other hand, it must be integrated to said control (11), such as a motor of equipment of low consumption or the starting coil to start a motor of any capacity provided that its operation may be halted for the scheduled periods of time.

With the installation of these controls, the capacity of the plants will considerably increase, since excessive consumption in the critical periods will be eliminated and the number of services could be increased, without increasing the generation capacity.

The saving controls can be connected to the existing equipment, or be integrated to the new equipment as well, whichever is their function, so as to allow them to shut-off for short periods of time. These periods of time are selected according to the behavior of the regional demand, for example operation can be stopped for four or more periods of 6 minutes and 15 seconds±10 seconds (the period of time can vary according to the needs), for a term of 3 hours and 30 minutes (this term will vary according to the critical periods of demand).

The saving controls are synchronized in staggered form through a program according to the demand and consumption of electric power of each region and their operation is, such that during a critical period a group of appliances will stop operating for a period of time, the expiration of which will indicate to another group of appliances to stop operating for the same period of time, and other groups of appliances will follow one another this way, so that during the critical consumption hours each group will be shut-off for at least 3 or 4 periods, as necessary, in order to diminish the demand in such period of critical consumption.

In this way, it will be possible to diminish the electric power demand in the critical consumption periods, according to each region, and will result in such a more constant behavior of the demand that the generation plants won't go through periods of overloads.

Figure 3:
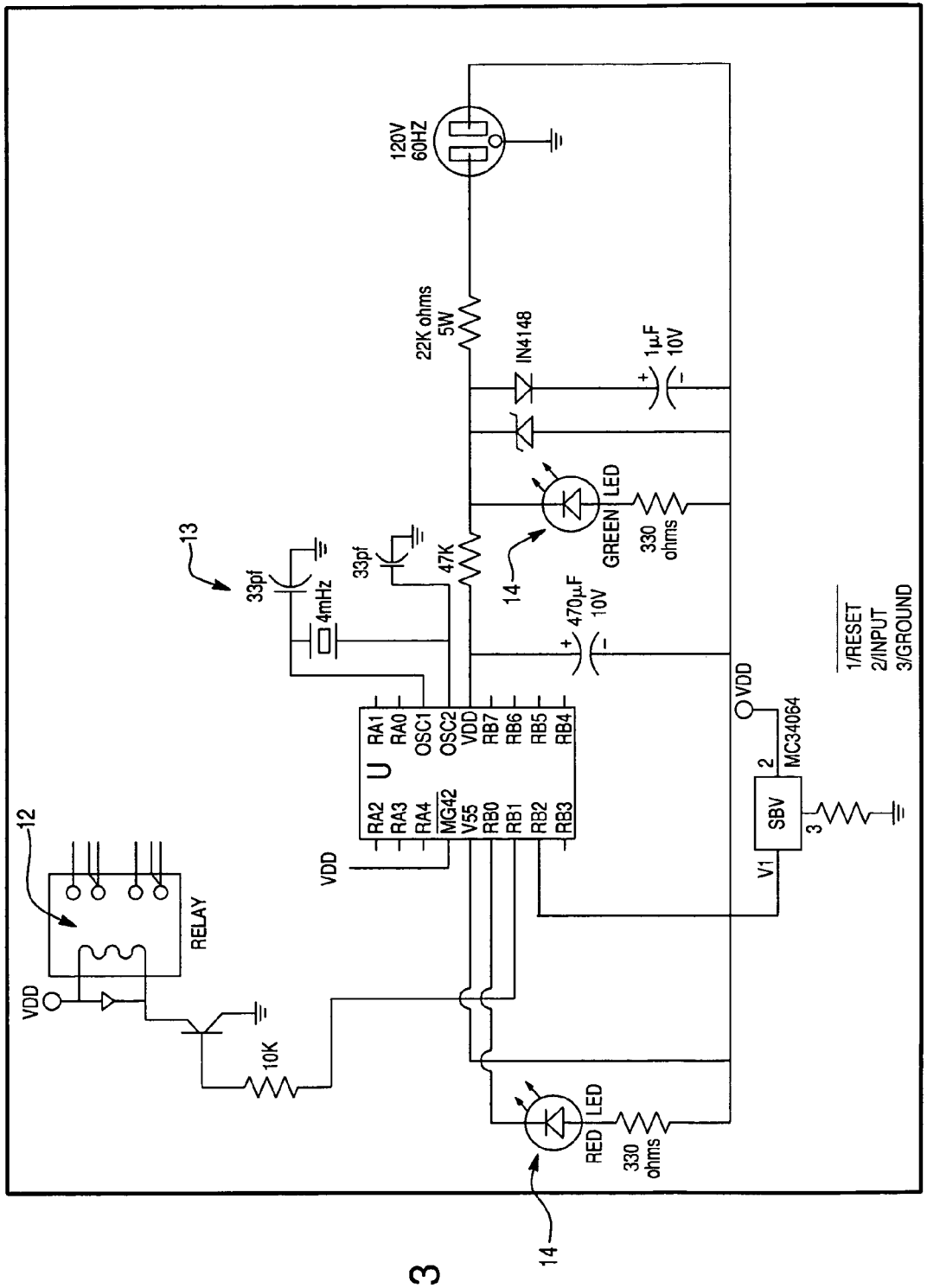
FIG. 3 shows the topography of an electric circuit which is incorporated to the energy saving device.

There are several forms to make electric circuits, as shown in FIG. 3, in which the energy saving system can operate. Taking into account the circuit of FIG. 3, it must have an outlet to the equipment to be controlled (12), one microprocessor (13) programmed to carry out the desired function and the LEDs (14) indicating the status.

Figure 5:
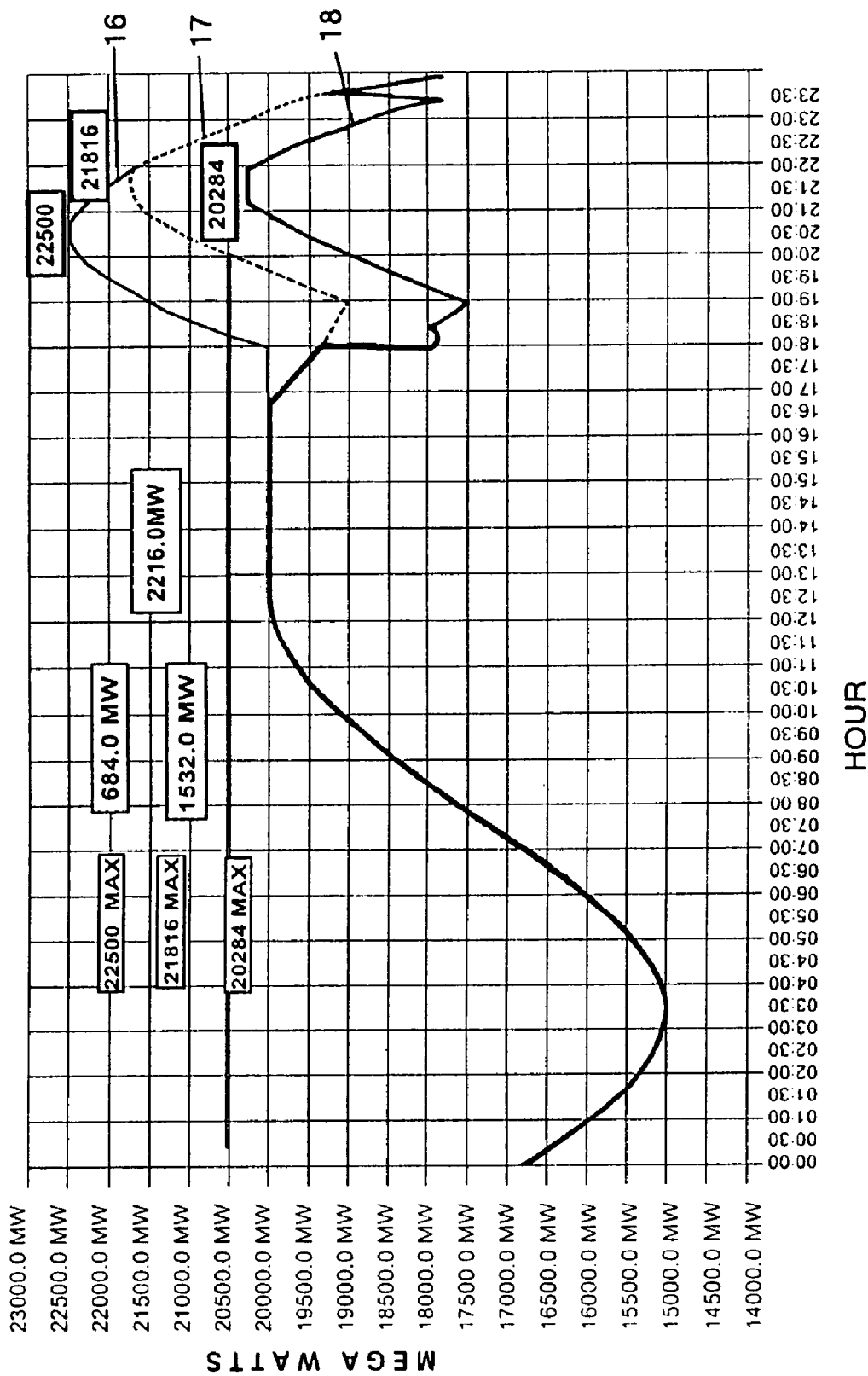
FIG. 5 shows a chart of the behavior of the energy demand during a certain period of time.
Figure 6:
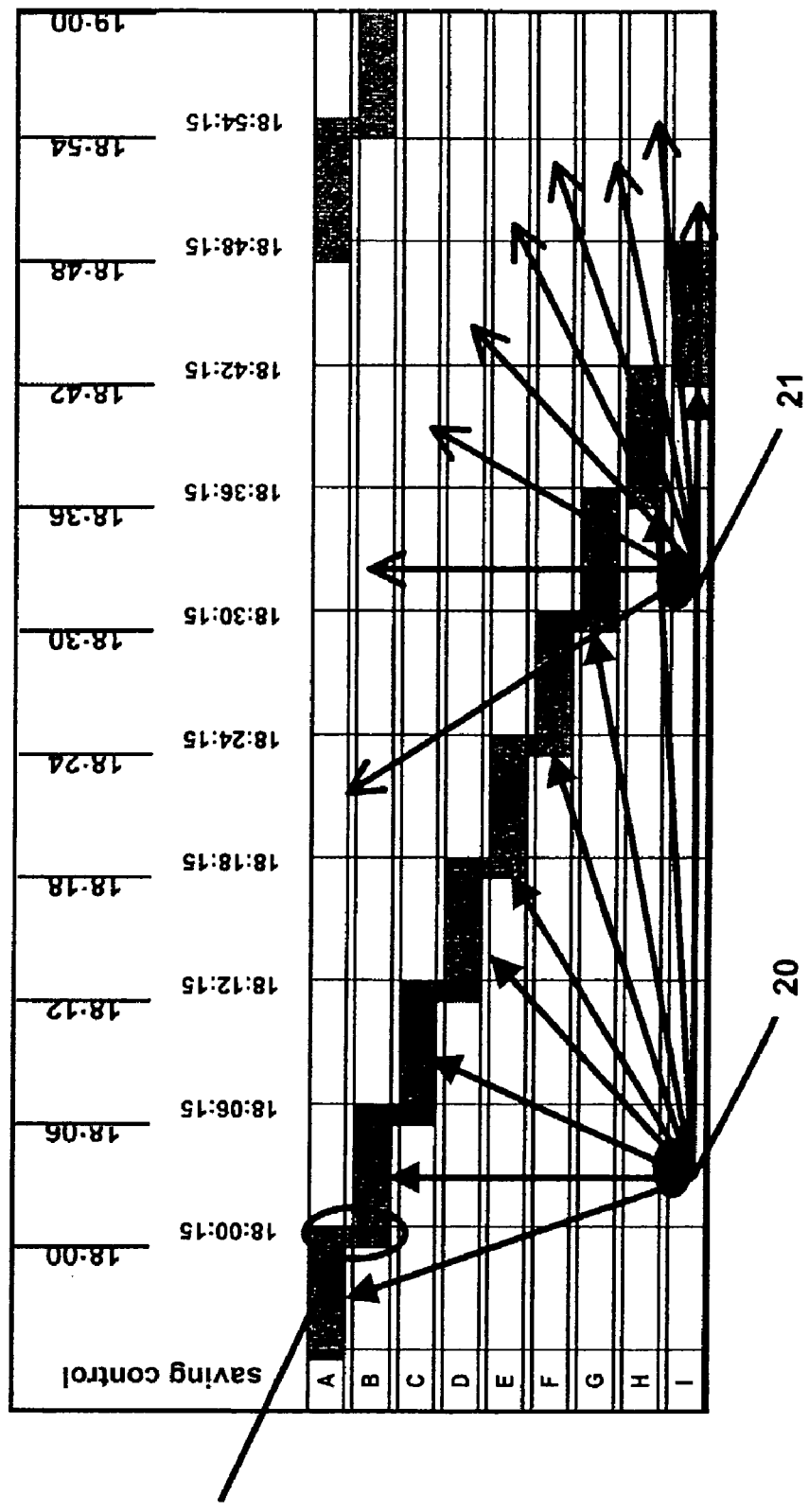

FIG. 5 illustrates the behavior of the energy demand in Mexico (16) for 1998 (approximated data). An increase in the demand between 18:00 to 23:00 hours can be observed. According to the chart, with the implementation of the daylight saving plan, a reduction of the demand was obtained (17) for that period, nevertheless it is insufficient in order to avoid the upward peak that signifies an overload for the generation plants. With the saving system of the present invention, upon installation of the appropriate quantity of energy saving controllers to produce small cut-offs in the operation of the energy-consuming devices, a much greater saving would be achieved (18), which would avoid and eliminate the additional load, as it is observed in the chart at the demand peak during critical hours, achieving even shows a greater reduction for some periods, thereby meeting the objectives of the invention.

EXAMPLES

Example 1

Figures 4, 6:
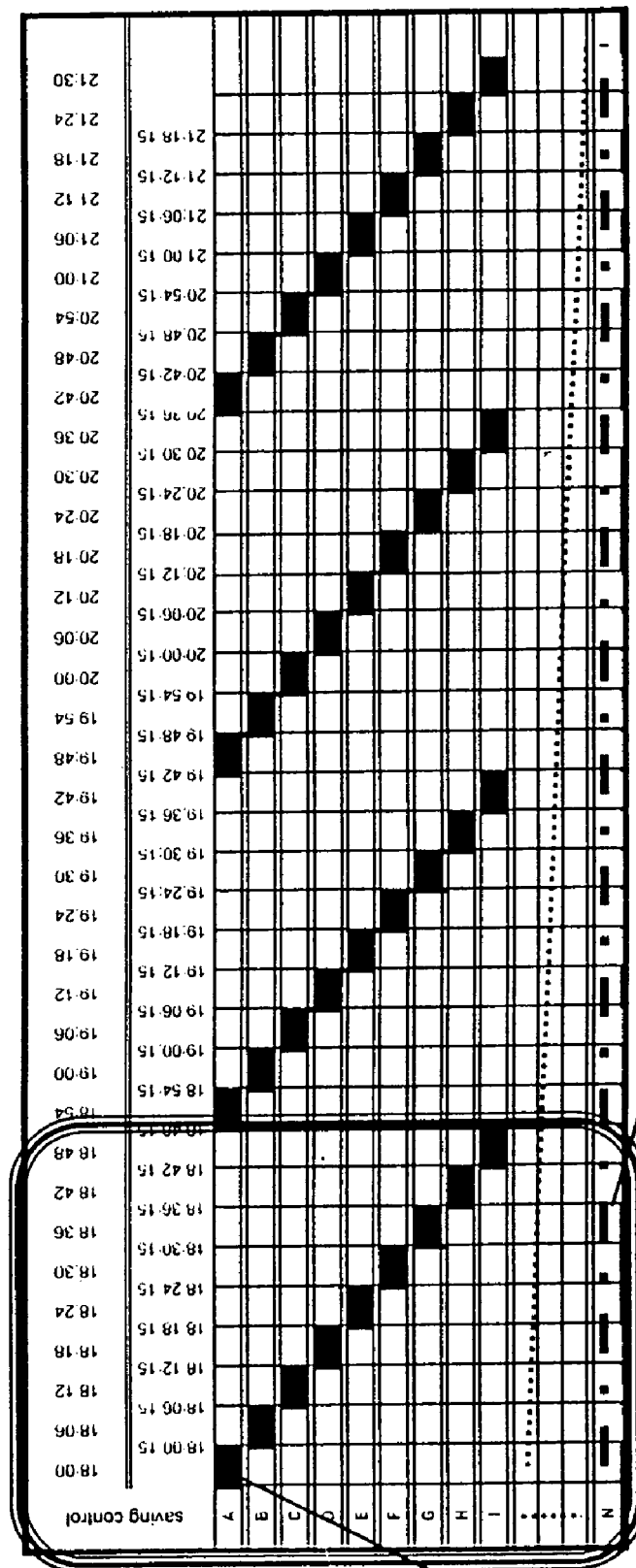
FIG. 4 shows a chart of the synchrony of the energy savers used in a staggered form.
FIG. 6 shows a chart of one of many programs which can be carried out with the energy savers of this invention.

FIG. 4 illustrates an example of the programming or scheduling of saving contacts for a given population. The chart includes, on one hand, the groups of saving contacts from A to N that will shut-off the devices (15) connected to it, within the span between 18:00 to 21:30 hours, which is supposed to be the critical period of electric power demand for a population.

In this example, interruptions in the operation of the equipment for periods of six minutes and fifteen seconds are caused. This shut-off scheduling of the equipment will switch such devices off for enough time so as to have an optimum operation, and at the same time for not affecting their actual operation. It is necessary that the critical hours are detected, so that said programming can be set in order to perform the installation of saving controls in the appropriate electric equipment, to achieve the electric power saving objective.

For a better identification of the cut-off periods, Table 1 shows the programming of a set of groups of energy savers and the times at which they are shut-off (Shut-off) and when they start again (Start-up).

TABLE 1

| | SAVING CONTROLS | | | | | | | |
|---|---|---|---|---|---|---|---|---|
| TYPE | SHUT-OFF | START UP | SHUT-OFF | START UP | SHUT-OFF | START UP | SHUT-OFF | START UP |
| ca-A | 17:54:00 | 18:00:15 | 18:48:00 | 18:54:15 | 19:42:00 | 19:48:15 | 20:36:00 | 20:42:15 |
| ca-B | 18:00:00 | 18:06:15 | 18:54:00 | 19:00:15 | 19:48:00 | 19:54:15 | 20:42:00 | 20:48:15 |
| ca-C | 18:06:00 | 18:12:15 | 19:00:00 | 19:06:15 | 19:54:00 | 20:00:15 | 20:48:00 | 20:54:15 |
| ca-D | 18:12:00 | 18:18:15 | 19:06:00 | 19:12:15 | 20:00:00 | 20:06:15 | 20:54:00 | 21:00:15 |
| ca-E | 18:18:00 | 18:24:15 | 19:12:00 | 19:18:15 | 20:06:00 | 20:12:15 | 21:00:00 | 21:06:15 |
| ca-F | 18:24:00 | 18:30:15 | 19:18:00 | 19:24:15 | 20:12:00 | 20:18:15 | 21:06:00 | 21:12:15 |
| ca-G | 18:30:00 | 18:36:15 | 19:24:00 | 19:30:15 | 20:18:00 | 20:24:15 | 21:12:00 | 21:18:15 |
| ca-H | 18:36:00 | 18:42:15 | 19:30:00 | 19:36:15 | 20:24:00 | 20:30:15 | 21:18:00 | 21:24:15 |
| ca-I | 18:42:00 | 18:48:15 | 19:36:00 | 19:42:15 | 20:30:00 | 20:36:15 | 21:24:00 | 21:30:15 |
| . | | | | | | | | |
| . | | | | | | | | |
| . | | | | | | | | |
| ca-N | xx:yy:zz | xx:yy:zz | xx:yy:zz | xx:yy:zz | xx:yy:zz | xx:yy:zz | xx:yy:zz | xx:yy:zz |

These data are shown in FIGS. 4 and 6, as a relationship of the energy consumption measured in miliwatts-hour per hour between 14:00 to 24:00 hours, where an increment in the demand is observed between 18:00 to 21:30 hours, and also shows the reductions obtained in the demand upon implementation of the daylight saving plan, and upon installation of saving controls according to the invention, said saving control will operate during the critical hours. As it is observed, the saving obtained by the invention system surpasses to a great extent the one obtained with the implementation of the daylight saving plan. In the same way, FIG. 6 shows one of the many ways in which saving controls can be programmed, as for example in Mexico. In this case a system of 9 categories of saving controls was proposed (Ca-A, Ca-B ... Ca-N); the quantity depends on the behavior of the demand and on the energy consumption, where the shut-off periods (19), as same as the time intervals in which the appliances are out of operation (20), are considered, and the same appliances must have one operation signal (21).

Example 2

Some field tests were carried out to probe the effectiveness of the saving control of this invention and the achievement of the objective of the system.

Figure 7:
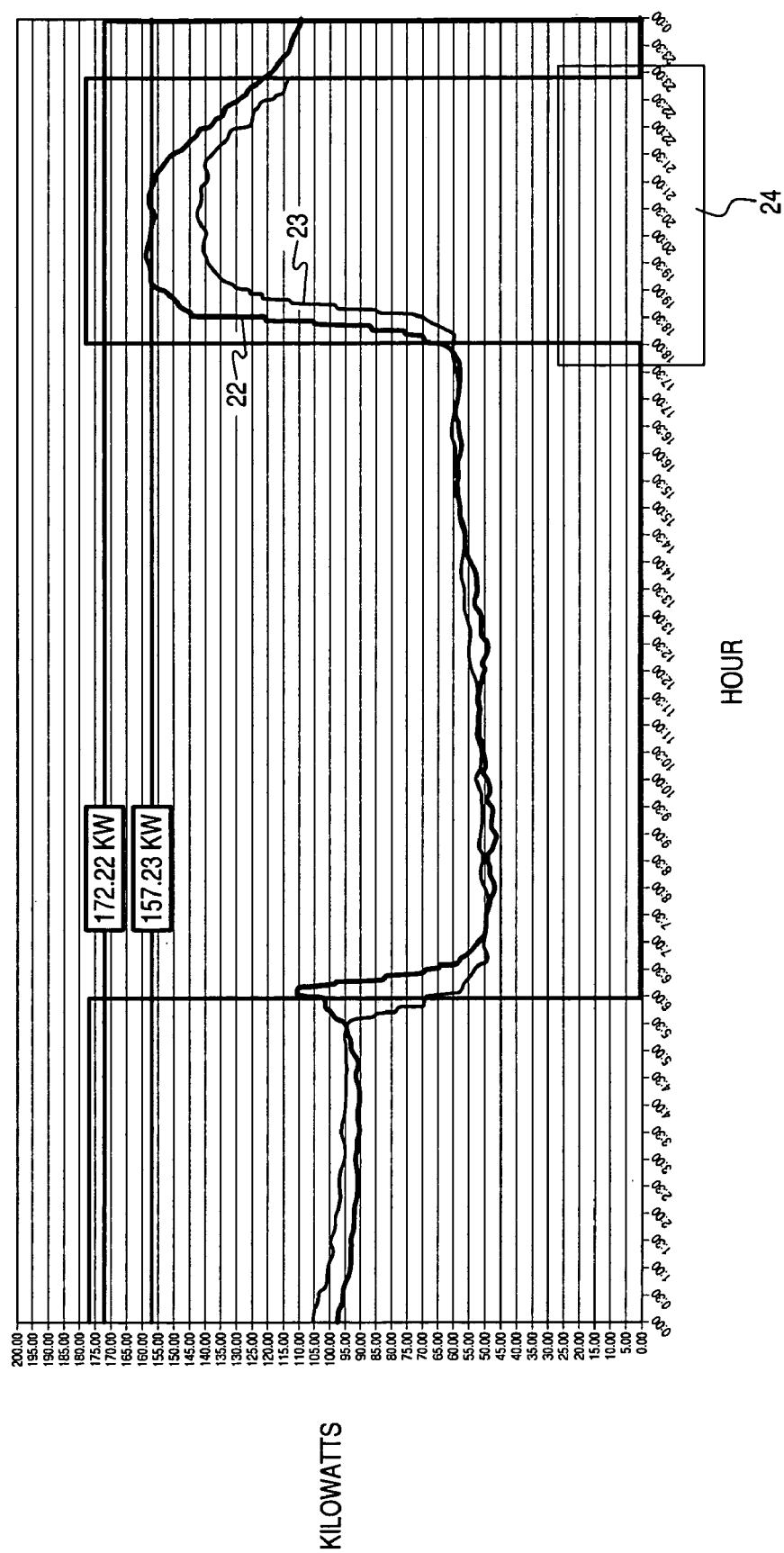
FIG. 7 shows a chart of the effectiveness of the energy saver of this invention.

The tests were carried out at Fraccionamiento La Sirena, Sinaloa, Mexico, obtaining favorable results for the demand and energy consumption, just as FIG. 7 points out. A profile of the energy consumption behavior (22) was obtained, and the profile obtained with the energy saving controls (23) is also shown. During this exercise, specific saving controls were chosen for this case, and they consisted of the saving controls type A, type B, ... type F, with shut-off periods of 10 minutes and 15 seconds, every hour starting from 18:00 hours and concluding at 23:00:15 hours (24) as indicated in Table 2.

During the tests, 124 controls were installed in refrigerators and 54 controls were installed in street lighting lamps, obtaining the results shown in Table 3.

The obtained results showed a saving in energy consumption of 12.991% which is equivalent to 91.2 KWH, and a saving in the demand of 10.437% which is equivalent to 16.5 KW.

It is important to stand out that when an energy failure happens, the saving controls will begin their operation in staggered form with intervals of time that may go from one second up to the desired time, which prevent an excessive demand for the generation plant.

Example 3

A mathematical model was created assuming that 40,000 street lighting lamps were controlled, and that each lamp generally consumes 0.40 KW. The saving controls of this invention were installed in 60% of the street lighting lamps and the remaining 40% worked normally. The street lighting lamps having no saving control installed, operated during 12 hours (from 18:00 to 6:00 hours), while the street lighting lamps with the saving control installed, were divided into two groups, one operating for 12 hours and the other one operating for 8 hours. In this way, the consumption for the group of street lighting lamps without controller was of 192,000 KWH, while for the group of street lighting lamps with controller operating during 12 hours was only 145,920 KWH, and for the controlled street lighting lamps operating during 8 hours was 30,720 KWH. Therefore, the additional saving

TABLE 2

| SAVINGS | SHUT-OFF 1 | | SHUT-OFF 2 | | SHUT-OFF 3 | | SHUT-OFF 4 | | SHUT-OFF 5 | |
|---|---|---|---|---|---|---|---|---|---|---|
| CONTROL | from | to | from | to | from | to | from | to | from | to |
| TYPE A | 18:00:00 | 18:10:15 | 19:00:00 | 19:10:15 | 20:00:00 | 20:10:15 | 21:00:00 | 21:10:15 | 22:00:00 | 22:10:15 |
| TYPE B | 18:10:00 | 18:20:15 | 19:10:00 | 19:20:15 | 20:10:00 | 20:20:15 | 21:10:00 | 21:20:15 | 22:10:00 | 22:20:15 |
| TYPE C | 18:20:00 | 18:30:15 | 19:20:00 | 19:30:15 | 20:20:00 | 20:30:15 | 21:20:00 | 21:30:15 | 22:20:00 | 22:30:15 |
| TYPE D | 18:30:00 | 18:40:15 | 19:30:00 | 19:40:15 | 20:30:00 | 20:40:15 | 21:30:00 | 21:40:15 | 22:30:00 | 22:40:15 |
| TYPE E | 18:40:00 | 18:50:15 | 19:40:00 | 19:50:15 | 20:40:00 | 20:50:15 | 21:40:00 | 21:50:15 | 22:40:00 | 22:50:15 |
| TYPE F | 18:50:00 | 19:00:15 | 19:50:00 | 20:00:15 | 20:50:00 | 21:00:15 | 21:50:00 | 22:00:15 | 22:50:00 | 23:00:15 |

TABLE 3

NO CONTROLS FROM MARCH 1st TO 15th VERSUS
CONTROLS IN REFRIGERATORS AND STREET LIGHTING
LAMPS FROM APRIL 1st TO 16TH, WITH
ADJUSTED-CONSUMPTION ADJUSTMENT
ADJUSTED FROM 06:00 TO 18:00 AND FROM 23:00 TO 0:00

| | | | 0.00 KWH | 0.00 KWH | SC AVERAGE WITH ADJUSTMENT |
|---|---|---|---|---|---|
| | | ADJUSTED | 656.82 KWH | 657.21 KWH | |
| | SAVINGS | | 111.36 KWH | 110:97 KWH | AVERAGE DC |
| CONSUMPTION | 12.991% | 91.2 KWH | 765.17 KWH | 768.17 KWH | |
| DEMAND | 10.437% | 16.5 KW MAX | | -0.00 KWH | | obtained when programming a shut-off schedule at 2:00 a.m. in the controlled lamps was 15,360 KWH, as shown in Table 4.

TABLE 4

| lighting lamps installed in a district | 4000 | EACH LAMP CONSUMES | | | | |
|---|---|---|---|---|---|---|
| 60% controlled lighting lamps | 24000 | | | | | |
| 40% not controlled lighting lamps | 16000 | | | | | |

| NOT CONTROLLED CONSUMPTION | | | | ACHIEVED CONTROLLED CONSUMPTION | | |
|---|---|---|---|---|---|---|
| operation schedule | | operation time | not controlled consumption | operation schedule | | |
| from | to | | | from | to | operation time | not controlled consumption |
| 18:00 | 06:00 | 12 hours | 192000 KWH | 18:00 | 06:00 | 12 hours | 145920 KWH |
| | | | | 18:00 | 02:00 | 8 hours | 30720 KWH |
| | | | | | | | 176640 KWH |

| ADDITIONAL SAVINGS ACHIEVED BY PROGRAMING A SHUT-OFF SCHEDULE AT 2:00 AM FOR CONTROLLED LAMPS | 15360 KWH |
|---|---|

Example 4

A laboratory test was carried out in a refrigerator to which an energy saver of this invention was installed, besides helping to reduce the energy demand the controller also reduced the energy consumption which, as shown from the results obtained in Table 5, was of 25%, 81% and 41.52, indicating that the effectiveness of the energy savers claimed in this invention increases in a significant way.

Figure 8:
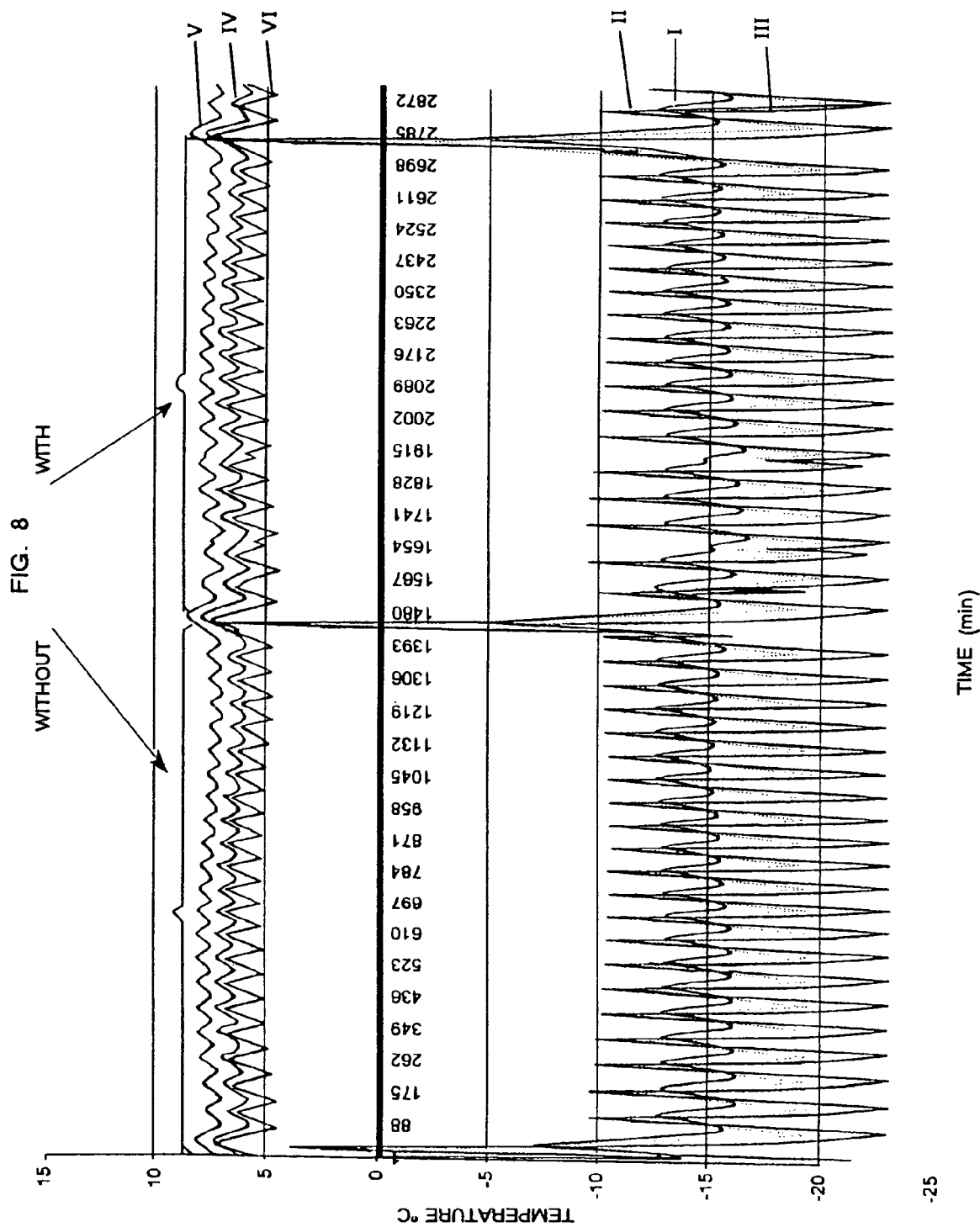
FIGS. 8 to 13 shows the behavior of a refrigerator (freezer) operating with and without the energy saver of this invention, respectively.
Figure 9:
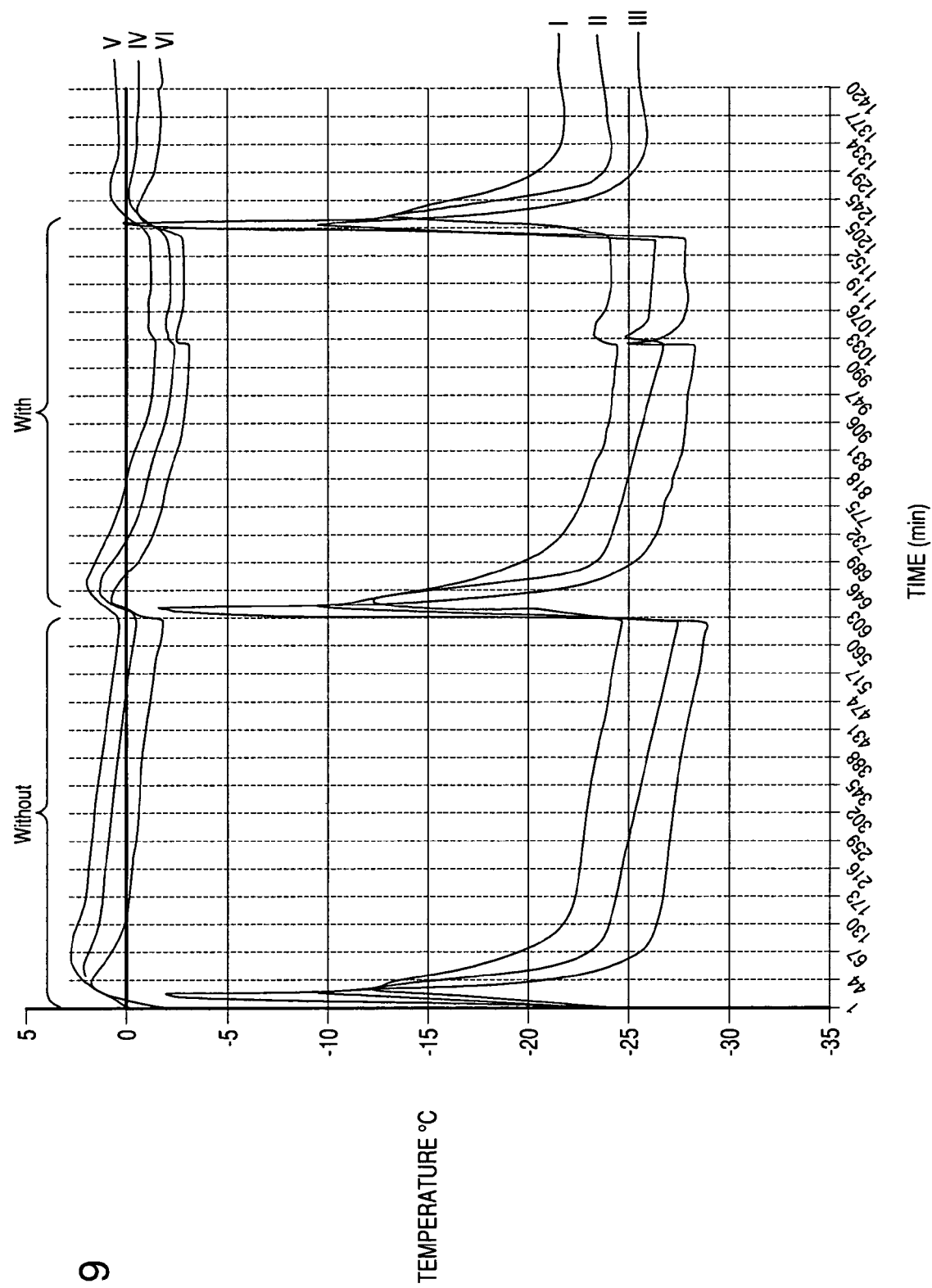

A refrigerator/freezer (R/F) with automatic defrost was used for this test, obtaining the results shown in FIGS. 8 and 9.

The results obtained when the freezer was tested with and without the energy saver, the thermostat being set at the minimum position (FIG. 8), are shown as a chart in FIGS. 8 and 9, and the same data were obtained with and without the energy saver but with the thermostat set to normal position (FIG. 9), the food temperature values (I, II, and III) and freezer temperature (IV, V, and VI) are shown as a chart.

Figure 10:
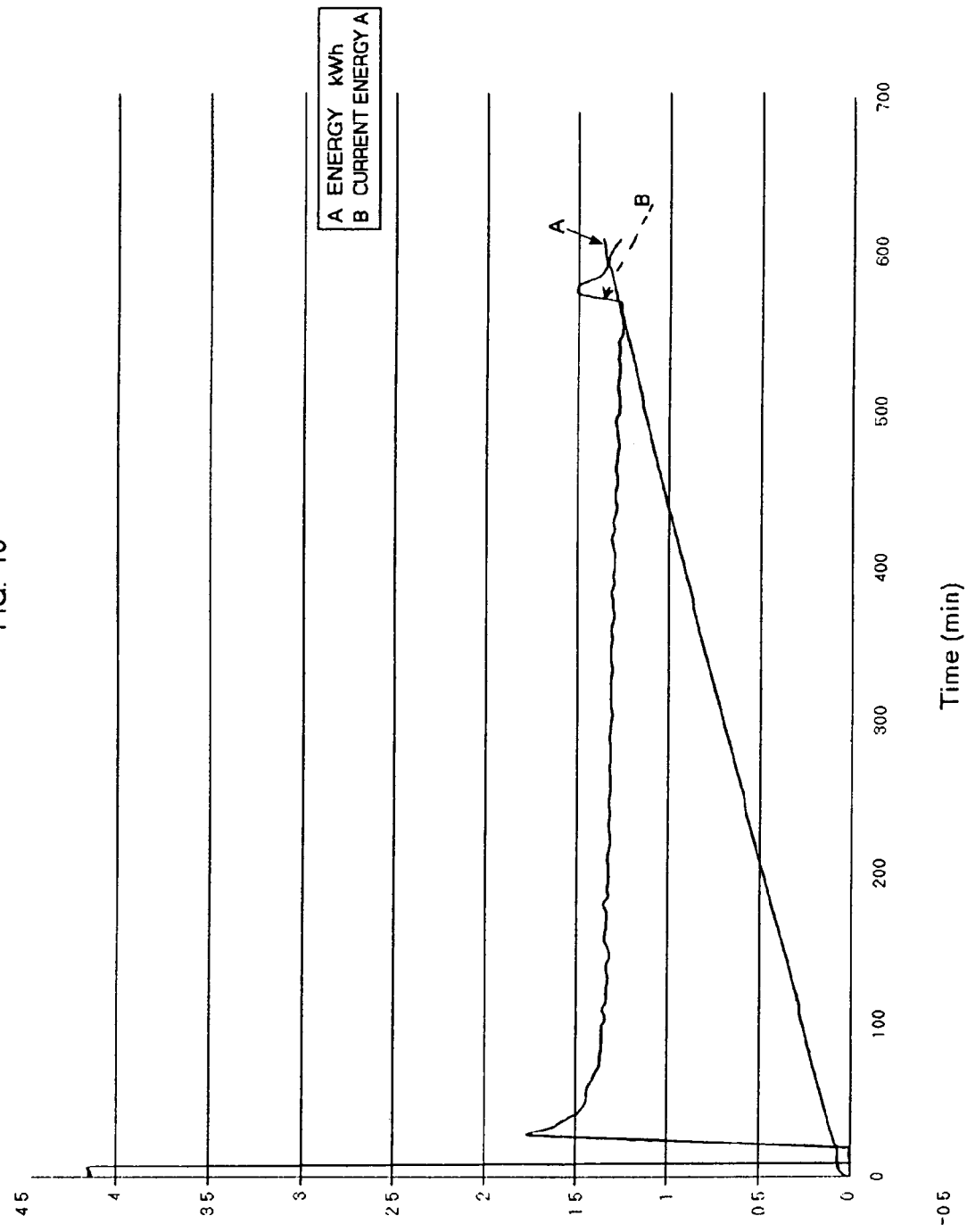
Figure 11:
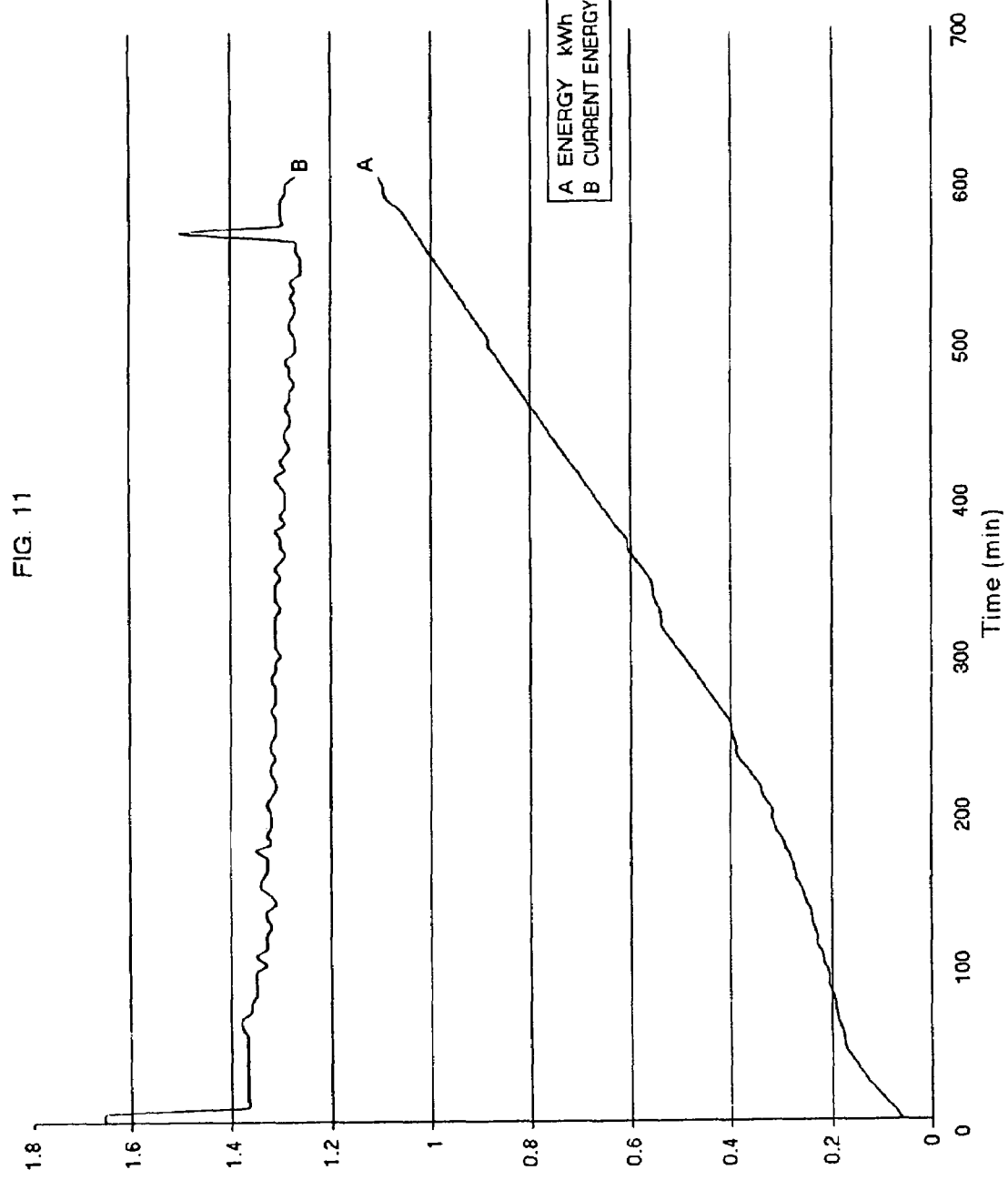

FIGS. 10 and 11 show a chart for the results obtained for the current energy (B) vs the energy in kWh (A) used by the refrigerator/freezer when the thermostat was in normal position and without the energy saver installed (FIG. 10); as same as the results obtained from current energy used by the refrigerator/freezer when the thermostat is in normal position but with the energy saver of this invention installed (FIG. 11).

Figure 12:
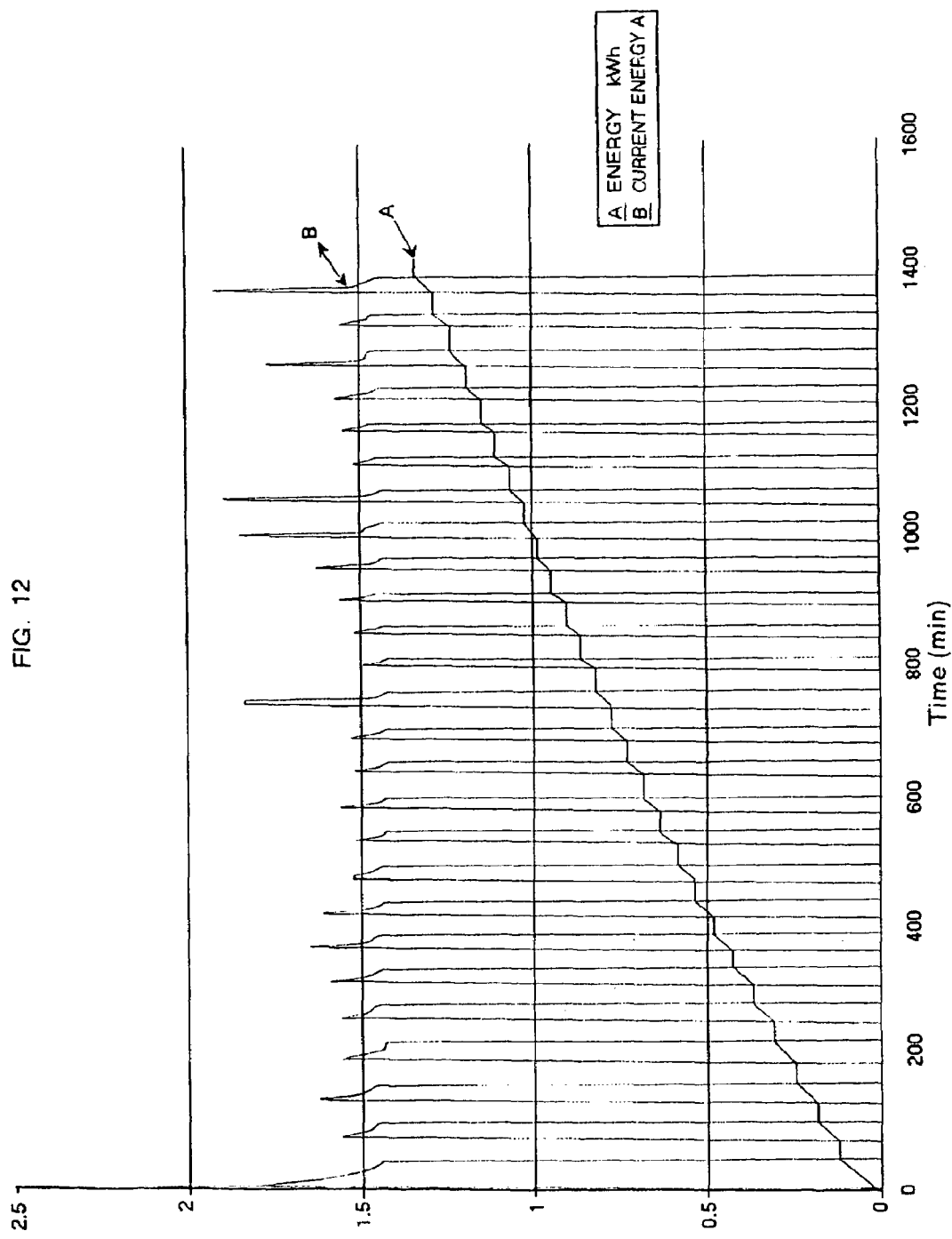
Figure 13:
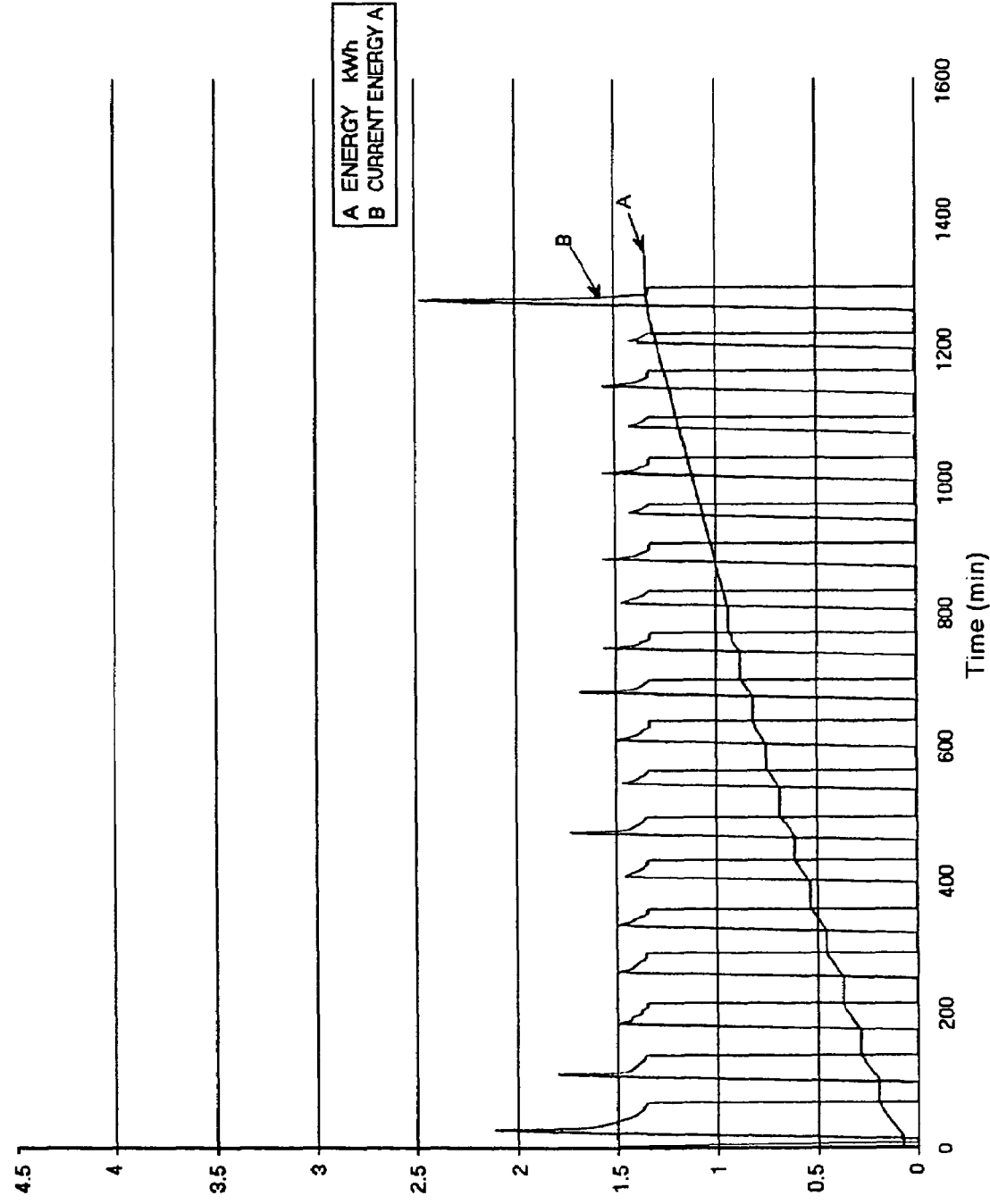

FIGS. 12 and 13 show the results obtained for the current energy (b) vs the energy in KWH (A) used by the refrigerator/freezer when the thermostat was at the minimum position of the scale, and the energy saver installed (FIG. 12) and not installed (FIG. 13).

TABLE NO. 5

| ANNUAL POWER CONSUMPTION | POWER CONSUMPTION MAXIMUM LIMIT (Kwh/year) | POWER SAVING (%) | LEVEL STATED IN POWER CONSUMPTION LABEL | CONSUPTION STATED IN POWER CONSUMPTION LABEL (Kwh/year) |
|---|---|---|---|---|
| 625.61/ 493.12 | 843.22 | 24.81/ 41.52 | 834 | 620 |

It will be obvious to those skilled in the art that various changes and modifications to the described invention may be made without departing from the spirit and scope of the invention, reason why it must be understood that everything herein described and illustrated is solely for purposes of illustration of the invention and is not intended to limit the scope of the invention.

The invention claimed is:

1. An electric energy saving method comprising:
    detecting spans of time when there is an overload in demand of energy of a region;
    providing a plurality of controllers, wherein each controller is individually programmable and is connected to a corresponding device connected to an energy distribution system of said region according to said overload recorded for said region; and
    programming each controller to shut-off its corresponding device such that the controllers shut-off said devices for several short time periods, in a staggered form, during said spans of time when there is an overload of the demand in the region, in such a way that a group of devices will be shut-off for one period, the expiration of which will indicate another group to do the same thing, wherein each controller is programmed with a pre-determined and fixed schedule of shut-off and start-up periods for shutting off and starting up the controller's corresponding device.

2. The electric energy saving method according to claim 1, wherein when a new increment of the demand is detected, new programmable controllers are incorporated to devices connected to the electric distribution system, and programmed to shut-off within a new span of time when there is an overload of the energy demand.

3. An energy load regulation system, comprising:
    a plurality of energy-consuming devices connected to an energy distribution system of a region; and
    a plurality of controllers each adapted to control a flow of power to at least one corresponding energy-consuming device,
    wherein each controller is programmed to interrupt the flow of power to the corresponding device for a shut-off interval and to reestablish the flow of power to the device according to a predetermined schedule,
    wherein the schedule defines a fixed start time of a period of high energy demand for the region, a fixed length of time of the shut-off interval, and a fixed number of shut-off intervals to be completed by each controller during the period of high energy demand, wherein the plurality of controllers includes at least two categories of controllers, and wherein an initial shut-off interval for a first category of controllers begins at the fixed start time and an initial shut-off interval for a second category of controllers begins at a time later than the fixed start time by approximately the fixed length of time of the shut-off interval.

4. The energy load regulation system of claim 3, wherein the length of time of the shut-off interval is approximately 6 minutes and 15 seconds.

5. The energy load regulation system of claim 3, wherein the plurality of energy-consuming devices comprises street lamps, refrigerators, hot water heaters, electric clothes driers, or any combination thereof.

6. The energy load regulation system of claim 3, wherein a portion of the plurality of controllers are installed in the corresponding energy-consuming device.

7. The energy load regulation system of claim 3, wherein a portion of the plurality of controllers are adapted to be plugged into an energy source and include an outlet adapted to receive an electrical plug from the corresponding energy-consuming device.

8. The energy load regulation system of claim 3, wherein the number of shut-off intervals to be completed by each controller during the period of high energy demand is three or more.

9. The energy load regulation system of claim 3, wherein the controller or the corresponding device includes a visible sticker indicating the schedule.

10. A method of controlling an energy load regulation system, comprising:

providing first and second energy-consuming devices connected to an energy distribution system of a region;

providing a first controller connected to the first device and a second controller connected to the second device;

programming the first controller to shut off the first device at a first fixed designated time and to turn on the first device after a predetermined fixed time interval has passed; and programming the second controller to shut off the second device at a second fixed designated time and to turn on the second fixed device after the predetermined fixed time interval has passed, wherein the first fixed designated time corresponds to a beginning of a period of high energy demand for the region, and wherein the second fixed designated time is later than the first fixed designated time by approximately a length of the predetermined fixed time interval.

11. The method of controlling an energy load regulation system of claim 10, wherein the first and second controllers are configured to shut off the respective devices by interrupting a supply of power to the respective devices.

12. The method of controlling an energy load regulation system of claim 10 wherein at least one of the first and second controllers is configured to be installed in the respective device.

13. The method of controlling an energy load regulation system of claim 10, wherein at least one of the first and second controllers is configured to be plugged into an energy source and includes an outlet adapted to receive an electrical plug from the respective device.

14. The method of controlling an energy load regulation system of claim 10, wherein the predetermined time interval is approximately 6 minutes and 15 seconds.

15. The method of controlling an energy load regulation system of claim 10, wherein the predetermined time interval is approximately 10 minutes and 15 seconds.

16. The method of controlling an energy load regulation system of claim 10, wherein at least one of the first and second controllers includes a temperature sensor.

17. The energy load regulation system of claim 3, wherein the length of time of the shut-off interval is based on energy demand characteristics of the region.

18. The method of controlling an energy load regulation system of claim 10, wherein the predetermined time interval is determined based on a behavior of regional energy demand.

19. The energy load regulation system of claim 3, wherein the plurality of controllers includes at least one subsequent category of controllers, and wherein an initial shut-off interval for each subsequent category of controllers begins at a time later than an initial shut-off interval for a previous category of controllers by approximately the length of time of the shut-off interval of the previous category of controllers.

20. The energy load regulation system of claim 3, wherein the plurality of energy-consuming devices includes equipment configured so that operation of the equipment can be suspended without affecting a function of the equipment.

21. The energy load regulation system of claim 3, wherein the plurality of energy-consuming devices includes low consumption motor equipment of any capacity.

22. A method of controlling an energy load regulation system, comprising:

determining a period of high energy demand for a region;

providing a plurality of energy-consuming devices connected to an energy distribution system of the region;

providing a plurality of controllers each associated with at least one of the energy-consuming devices;

determining at least two categories of controllers;

classifying at least one controller into the first category of controllers and at least one controller in the second category of controllers;

programming the first category of controllers to shut off the associated energy-consuming devices at a first fixed designated time and to turn on the associated energy-consuming devices after a predetermined fixed time interval has passed; and programming the second category of controllers to shut off the associated energy-consuming devices at a second fixed designated time and to turn on the associated energy-consuming devices after the predetermined fixed time interval has passed, wherein the first fixed designated time corresponds to a beginning of the period of high energy demand for the region, and wherein the second fixed designated time is later than the first fixed designated time by approximately a fixed length of the predetermined time interval.

23. The method of controlling an energy load regulation system of claim 22, further comprising:

determining a plurality of categories subsequent to the first and second categories;

classifying at least one controller into each of the subsequent categories;

programming each subsequent category of controllers to shut off the associated energy-consuming devices at a designated time and to turn on the associated energy-consuming devices after the predetermined time interval has passed, wherein the predetermined time interval for each subsequent category of controllers begins at a time later than the previous designated time by approximately the length of the predetermined time interval.

24. The method of controlling an energy load regulation system of claim 22, further comprising:
  programming the controllers to repeat the shut-off and turn on operations for the associated energy-consuming devices a predetermined number of times during the period of high energy demand of the region.

25. The electric energy saving method according to claim 1, wherein each controller comprises a microprocessor which are programmed in the programming step.

* * * * *